(12) United States Patent
Zhu et al.

(10) Patent No.: US 9,054,221 B2
(45) Date of Patent: Jun. 9, 2015

(54) SEMICONDUCTOR DEVICE WITH A COMMON BACK GATE ISOLATION REGION AND METHOD FOR MANUFACTURING THE SAME

(75) Inventors: Huilong Zhu, Poughkeepsie, NY (US); Qingqing Liang, Lagrangeville, NY (US); Zhijiong Luo, Poughkeepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/510,807

(22) PCT Filed: Nov. 18, 2011

(86) PCT No.: PCT/CN2011/082396
§ 371 (c)(1),
(2), (4) Date: May 18, 2012

(87) PCT Pub. No.: WO2013/029308
PCT Pub. Date: Mar. 7, 2013

(65) Prior Publication Data
US 2013/0049117 A1 Feb. 28, 2013

(30) Foreign Application Priority Data
Aug. 31, 2011 (CN) .......................... 2011 1 0254340

(51) Int. Cl.
*H01L 27/088* (2006.01)
(Continued)

(52) U.S. Cl.
CPC ............ *H01L 21/84* (2013.01); *H01L 27/1203* (2013.01)

(58) Field of Classification Search
CPC ............. H01L 21/762; H01L 21/7624; H01L 21/76264; H01L 21/1203; H01L 27/1207; H01L 2027/11857; H01L 29/7812; H01L 21/761; H01L 27/098; H01L 27/0928; H01L 29/0619; H01L 29/0646; H01L 29/1058; H01L 29/1066; H01L 27/0262; H01L 21/84; H01L 21/76205; H01L 21/76224; H01L 21/76283; H01L 21/76229; H01L 21/76232; H01L 27/1203
USPC ........................... 257/316, 544; 438/223, 224
See application file for complete search history.

(56) References Cited

U.S. PATENT DOCUMENTS
6,420,771 B2 * 7/2002 Gregory ......................... 257/517
(Continued)

OTHER PUBLICATIONS
International Search Report for PCT/CN2011/082396 dated Mar. 7, 2013.*
(Continued)

*Primary Examiner* — Khiem D Nguyen
*Assistant Examiner* — Pauline Vu
(74) *Attorney, Agent, or Firm* — Kinney & Lange, P.A.

(57) ABSTRACT

The present disclosure provides a semiconductor device and a method for manufacturing the same. The semiconductor device comprises: an SOI wafer comprising a semiconductor substrate, a buried insulation layer, and a semiconductor layer, wherein the buried insulation layer is disposed on the semiconductor substrate, and the semiconductor layer is disposed on the buried insulation layer; a plurality of MOSFETs being formed adjacently to each other in the SOI wafer, wherein each of the MOSFETs comprises a respective backgate being formed in the semiconductor substrate; and a plurality of shallow trench isolations, each of which being formed between respective adjacent MOSFETs to isolate the respective adjacent MOSFETs from each other, wherein the respective adjacent MOSFETs share a common backgate isolation region under and in direct contact with the respective backgate in the semiconductor substrate, and a PNP junction or an NPN junction is formed by the common backgate isolation region and the respective backgate of the respective adjacent MOSFETs. According to the present disclosure, respective backgates of two adjacent MOSFETs are isolated from each other by the shallow trench isolation. Furthermore, the two adjacent MOSFETs are also isolated from each other by the PNP or NPN junction formed by the respective backgates of the two adjacent MOSFETs and the common backgate isolation. As a result, this device structure has a better insulation effect over the prior art MOSFET and it greatly reduces the possibility of breakthrough.

12 Claims, 6 Drawing Sheets

(51) Int. Cl.
  *H01L 21/336* (2006.01)
  *H01L 21/84* (2006.01)
  *H01L 27/12* (2006.01)

(56) References Cited

U.S. PATENT DOCUMENTS

| | | | |
|---|---|---|---|
| 6,624,496 B2* | 9/2003 | Ku et al. | 257/510 |
| 7,023,054 B2* | 4/2006 | Ohsawa | 257/369 |
| 7,453,090 B2* | 11/2008 | Ito | 257/75 |
| 7,759,714 B2* | 7/2010 | Itoh et al. | 257/296 |
| 7,767,546 B1* | 8/2010 | Dennard et al. | 438/458 |
| 2003/0001658 A1* | 1/2003 | Matsumoto | 327/534 |
| 2005/0253197 A1* | 11/2005 | Tokushige | 257/347 |
| 2007/0102749 A1* | 5/2007 | Shirota et al. | 257/314 |
| 2007/0138533 A1* | 6/2007 | Dennard et al. | 257/314 |
| 2007/0210418 A1* | 9/2007 | Nakajima | 257/547 |
| 2009/0134468 A1* | 5/2009 | Tsuchiya et al. | 257/368 |
| 2009/0302366 A1* | 12/2009 | Anderson et al. | 257/301 |
| 2010/0200919 A1* | 8/2010 | Kikuchi | 257/351 |
| 2011/0074498 A1* | 3/2011 | Thompson et al. | 327/543 |
| 2011/0108942 A1* | 5/2011 | Fenouillet-Beranger et al. | 257/503 |
| 2011/0124177 A1* | 5/2011 | Botula et al. | 438/424 |
| 2012/0261792 A1* | 10/2012 | Cheng et al. | 257/510 |
| 2012/0292700 A1* | 11/2012 | Khakifirooz et al. | 257/347 |
| 2012/0299080 A1* | 11/2012 | Dennard et al. | 257/316 |
| 2012/0299105 A1* | 11/2012 | Cai et al. | 257/348 |

OTHER PUBLICATIONS

Yan, "Scaling the Si MOSFET: From Bulk to SOI to Bulk," IEEE Transactions on Electron Devices, vol. 39, No. 7, Jul. 1992.

Office Action dated Sep. 23, 2014, received for corresponding Chinese Application No. 201110254340.3.

* cited by examiner

SEMICONDUCTOR DEVICE WITH A COMMON BACK GATE ISOLATION REGION AND METHOD FOR MANUFACTURING THE SAME

This application is a National Phase application of, and claims priority to, PCT Application No. PCT/CN2011/082396, filed on Nov. 18, 2011, entitled "SEMICONDUCTOR DEVICE AND METHOD FOR MANUFACTURING THE SAME", which claimed priority to Chinese Application No. 201110254340.3, filed on Aug. 31, 2011. Both the PCT Application and Chinese Application are incorporated herein by reference in their entireties.

TECHNICAL FIELD

The present disclosure relates to a semiconductor device and a method for manufacturing the same, and in particular, to a semiconductor device with a backgate isolation region and a method for manufacturing the same.

BACKGROUND

Scaling down of Metal Oxide Semiconductor Field Effect Transistors (MOSFETs) is an important trend of the developing for integrated circuit technology, in order to improve integration level and reduce manufacturing cost. However, as is known to those skilled in the art, scaling down of the MOSFET will cause short channel effect. As the scaling down of the MOSFET, an effective length of a gate reduces accordingly. As a result, a proportion of depletion layer charges controlled by a gate voltage decreases, causing a threshold voltage decreases as a channel length decreases.

In the MOSFET, it is desirable to increase the threshold voltage of the device to suppress the short channel effect. On the other hand, in applications with low-voltage supply or applications employing both p-type MOSFETs and n-type MOSFETs, for example, it is also desirable to lower down the threshold voltage of the device to reduce power consumption.

Channel doping is a known method for adjusting the threshold voltage. However, if a dopant density of a channel region is increased to enhance the threshold voltage of the device, carrier mobilities will decrease, causing degradation of device performance. Furthermore, high-density ions in the channel region may neutralize ions in portions of source/drain regions adjoining the channel region. As a result, ion density in these portions decreases, causing device resistance to increase.

Yan et al. proposed in "Scaling the Si MOSFET: From bulk to SOI to bulk," IEEE Trans. Elect. Dev. Vol. 39, p. 1704, July, 1992, that in an SOI (Semiconductor-on-Insulator)-type MOSFET, a ground plane (i.e., a grounded backgate) can be disposed under a buried insulation layer to suppress the short channel effect.

In case that a plurality of MOSFETs are integrated on a wafer, backgates being biased with different electrical fields can be disposed under respective buried insulation layers of the plurality of MOSFETs to adjust the threshold voltages of the respective MOSFETs. However, with the scaling down of the device continuously, reliable electrical insulation between the backgates of adjacent MOSFET devices has become an urgent problem to be solved. Moreover, it also becomes difficult to achieve reliable electrical insulation between conductive vias of adjacent MOSFET devices.

SUMMARY

The present disclosure provides, among other things, a semiconductor device with a backgate isolation region and a method for manufacturing the same. In the semiconductor device, a backgate isolation region is disposed under backgates, so that respective backgate conductive vias of any two adjacent MOSFETs are electrically insulated from each other via a PNP junction or an NPN junction being formed by the backgates and the backgate isolation region.

According to one aspect of the present disclosure, there is provided a semiconductor device, comprising: an SOI wafer comprising a semiconductor substrate, a buried insulation layer, and a semiconductor layer, wherein the buried insulation layer is disposed on the semiconductor substrate, and the semiconductor layer is disposed on the buried insulation layer; a plurality of MOSFETs being formed adjacently to each other in the SOI wafer, wherein each of the MOSFETs comprises a respective backgate being formed in the semiconductor substrate; and a plurality of shallow trench isolations, each of which being formed between respective adjacent MOSFETs to isolate the respective adjacent MOSFETs, wherein the respective adjacent MOSFETs share a common backgate isolation region under the backgates in the semiconductor substrate, and a PNP junction or an NPN junction is formed by the common backgate isolation region and the backgates of the respective adjacent MOSFETs.

Each of the shallow trench isolations may comprise: a first portion extending downward into the semiconductor substrate and being configured to isolate the backgates of the respective adjacent MOSFETs from each other; and a second portion extending laterally on the buried insulation layer and being configured to isolate the semiconductor layers of the respective adjacent MOSFETs from each other so as to define active regions of the respective adjacent MOSFETs, wherein the first portion has a width smaller than that of the second portion.

Optionally, each of the backgates may adjoin the buried insulation layer.

Optionally, each of the backgates may be separated from the buried insulation layer.

Each of the MOSFETs may further comprises: a gate stack being disposed on the semiconductor layer; a source region and a drain region being formed in the semiconductor layer and being disposed outside the gate stack; and a channel region being formed in the semiconductor layer and located between the source region and the drain region. Furthermore, each of the MOSFETs may further comprise: source/drain conductive vias being electrically connected with the source region and the drain region, respectively; and a backgate conductive via being electrically connected with the backgate.

According to another aspect of the present disclosure, there is provided a method for manufacturing a semiconductor device, comprising: providing an SOI wafer, which comprises a semiconductor substrate, a buried insulation layer, and a semiconductor layer, wherein the buried insulation layer is disposed on the semiconductor substrate, and the semiconductor layer is disposed on the buried insulation layer; forming a plurality of shallow trench isolations for isolating a plurality of MOSFETs, which are to be formed adjacently to each other; and forming the plurality of MOSFETs in the SOI wafer, wherein each of the MOSFETs comprises a respective backgate being formed in the semiconductor substrate, wherein respective adjacent MOSFETs share a common backgate isolation region under the backgates in the semiconductor substrate; and wherein a PNP junction or an NPN junction is formed by the common backgate isolation region and the backgates of the respective adjacent MOSFETs.

Forming the plurality of MOSFETs may comprise: forming the common backgate isolation region in a deep location in the semiconductor substrate by a first deep ion implantation in the semiconductor substrate with a first dopant; forming each of the backgates in a shallow location in the semiconductor substrate by a second shallow ion implantation in the semiconductor substrate with a second dopant, wherein the second dopant has a type opposite to that of the first dopant.

Forming the plurality of shallow trench isolations may comprise: patterning the SOI wafer to form respective first portions of the shallow trench isolations, the first portions each extending downward into the semiconductor substrate to a depth sufficient for isolating the respective adjacent backgates; further patterning the SOI wafer to form respective second portions of the shallow trench isolations, the second portions each extending laterally on the buried insulation layer to isolate the semiconductor layers of the respective adjacent MOSFETs from each other, wherein the first portion has a width smaller than that of the second portion.

Forming the plurality of MOSFETs may comprise: forming respective gate stacks of the MOSFETs on the semiconductor layer; and forming a source region and a drain region outside each of the gate stacks in the semiconductor layer.

Forming the plurality of MOSFETs may further comprise: forming respective source/drain conductive vias electrically connected with the source regions and the drain regions; and forming respective backgate conductive vias electrically connected with the backgates.

As described above, the present disclosure provides the MOSFETs with a common backgate isolation region. The common backgate isolation region is formed under the backgates of the MOSFETs. The backgates have a different doping type than that of the common backgate isolation region. As a result, respective backgates of any two adjacent MOSFETs are isolated from each other by the shallow trench isolation.

Furthermore, the two adjacent MOSFETs are also isolated from each other by the PNP or NPN junction formed by the respective backgates of the two adjacent MOSFETs and the common backgate isolation. In this way, the respective backgate conductive vias of the two adjacent MOSFETs are electrically insulated from each other by the PNP junction or the NPN junction. This device structure has a better insulation effect over the prior art MOSFET and it greatly reduces the possibility of breakthrough.

Moreover, devices being applied with a same backgate voltage can be connected on a same side of the shallow trench isolation. Thus the shallow trench isolation of the devices need not extend into the substrate. Therefore, the conductive vias may occupy less area.

DETAILED DESCRIPTION OF EMBODIMENTS

Figure 1:
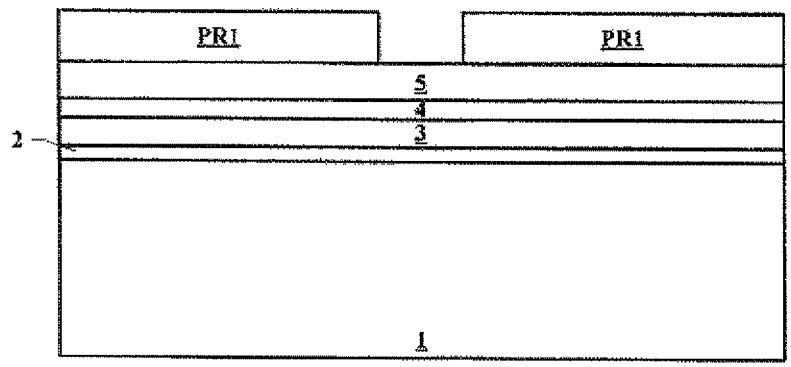
FIG. 1 to FIG. 11 schematically show cross-sectional views of respective steps of a method for manufacturing MOSFETs according to the present disclosure.

Next, the present disclosure will be more specifically explained with reference to the drawings. In the drawings, respective parts of the drawings are not drawn to scale for clarity.

Specific details of the present disclosure, such as structures, materials, sizes, and processes and techniques for processing the device, are described in the following description.

However, one of ordinary skill in the art will understand that the present disclosure can be implemented without these specific details. Unless being specifically indicated otherwise, respective parts of the semiconductor device may comprise materials known to one of ordinary skill in the art.

In the present disclosure, term "semiconductor substrate" refers to a semiconductor substrate and all layers or regions formed on the semiconductor substrate after respective steps for manufacturing the semiconductor device.

FIG. 1 to FIG. 11 show respective steps for manufacturing MOSFETs according to embodiments of the present disclosure.

As shown in FIG. 1, a typical SOI wafer is used as a semiconductor substrate, which is referred to as an initial structure. The semiconductor substrate comprises a semiconductor substrate 1, a buried insulation layer 2, and a semiconductor layer 3 in sequence from bottom to top. The semiconductor layer 3 has a thickness of e.g. about 5 nm-20 nm, which may be 10 nm or 15 nm, for example. The buried insulation layer 2 may have a thickness of e.g. about 5 nm-30 nm, which may be 10 nm, 15 nm, 20 nm, or 25 nm, for example. The buried insulation layer 2 may be any one of a group consisting of a buried oxide layer (BOX), a buried oxynitride layer, and other buried insulation layers. According to an embodiment, the buried insulation layer may be an ultra-thin buried oxide layer (UT-BOX).

The semiconductor substrate 1 may be used to provide backgates of the MOSFETs. The semiconductor substrate 1 may comprise a material selected from a group consisting of bulk-silicon, an IV group semiconductor material such as SiGe or Ge, and an III-V group compound semiconductor material such as gallium arsenide. The semiconductor layer 3 may comprises a semiconductor material selected from a group consisting of an IV group semiconductor material such as silicon, germanium, or silicon germanium and an III-V group compound semiconductor material such as gallium arsenide, for example. In this embodiment, the semiconductor layer 3 may be monocrystal Si or SiGe. The semiconductor layer 3 will be used for providing the source region, the drain region, and the channel region of each MOSFET.

As shown in FIG. 1, an oxide (e.g. silicon dioxide) layer 4 and a nitride (e.g. silicon nitride) layer 5 are deposited in sequence on the SOI wafer. For example, the oxide layer may have a thickness of about 5-20 nm. The nitride layer may have a thickness of about 30-100 nm. The oxide layer and the nitride layer will be used as a hard mask layer in a later chemical-mechanical polish (CMP) step. Furthermore, a patterned photoresist mask PR1 is formed on the nitride layer. Regions that are not covered by the photoresist mask PR1 correspond to portions where shallow trench isolations are to be formed.

Processes for forming the SOI wafer are known. For example, a SmartCut™ method may be used. The method comprises bonding two wafers with each other, wherein each wafer comprises an oxide surface layer formed by thermal oxidation or deposition. One of the two wafers has been processed by hydrogen implantation, whereby a hydrogen implantation region is formed in the silicon body at a certain depth under the oxide surface layer. The hydrogen implantation region becomes a microbubble layer under a high pressure and a high temperature, which microbubble layer helps to separate portions on two opposite sides of the microbubble layer. After the separation, a portion comprising the bonded oxide surface layer is used as the SOI wafer. The thickness of the buried insulation layer of the SOI wafer can be changed by controlling process parameters of the thermal oxidation or deposition. The thickness of the semiconductor layer in the SOI wafer can be changed by controlling hydrogen implantation energy.

Figure 2:
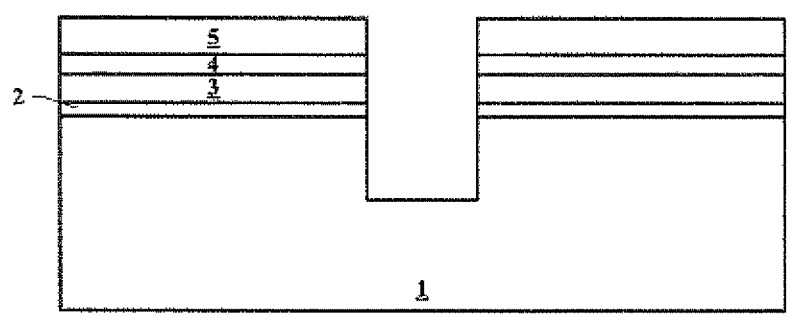

Then, the SOI wafer is patterned to form shallow trench isolations for isolating respective backgates of the MOSFETs, as shown in FIG. 2. In particular, respective layers of the SOI wafer are etched by e.g., Reaction Ion Etching (RIE) with the patterned photoresist mask PR1 as a mask. The etching stops at a depth of about 100-500 nm in the semiconductor substrate 1. As a result, shallow trenches are formed in the semiconductor substrate 1. The shallow trenches each extend downward into the semiconductor substrate and are used to isolate the backgates of respective adjacent MOSFETs that are to be formed. The shallow trenches correspond to respective first portions of the shallow trench isolations. After that, the photoresist mask PR1 is removed.

Figure 3:
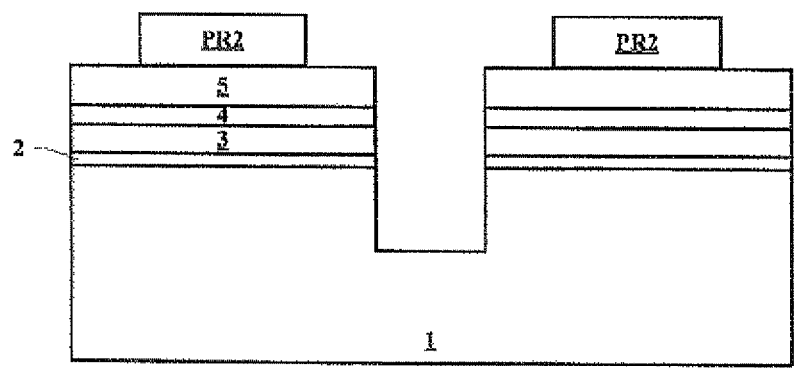

Next, a patterned photoresist mask PR2 is formed on the nitride layer 5 by means of photolithography comprising exposing and developing, as shown in FIG. 3. Regions that are not covered by the photoresist mask PR2 extend laterally above the buried insulation layer and correspond to respective second portions of the shallow trench isolations, which extend laterally.

Figure 4:
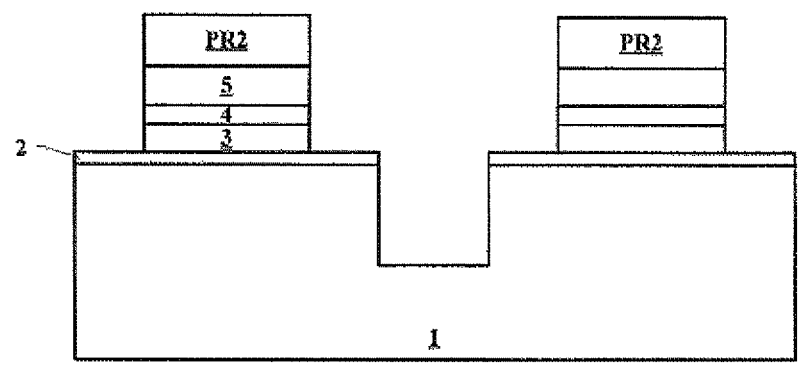

Then, the respective second portions of the shallow trench isolations extending laterally are formed by further patterning the SOI wafer. In particular, exposed portions of the SOI wafer are removed by means of dry etching (e.g., ion milling, plasma etching, reaction ion etching, or laser ablation) or by wet etching using etchant solution. In other words, portions of the nitride layer 5, the oxide layer 4, and the semiconductor layer 3 that are not covered by the mask are etched in sequence, until the etching stops at a top of the buried insulation layer 2. The etching also increases the depth of the respective first portions of the shallow trench isolations formed in the semiconductor substrate 1, as shown in FIG. 4. After that, the photoresist mask PR2 is removed by being dissolved in a solution or by cineration.

Figure 5:
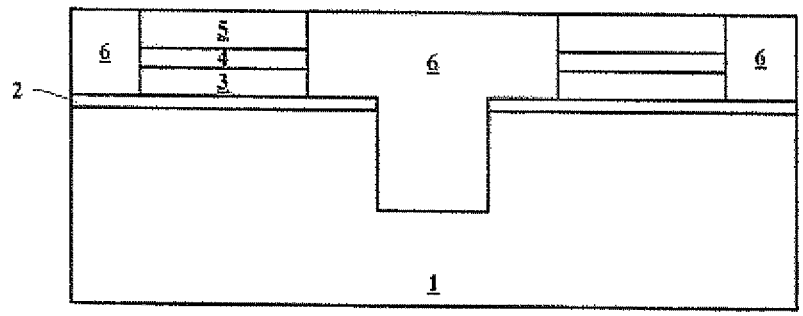

Then, an insulating material is deposited in the trenches that have been formed and then planarized by chemical-mechanical polish (CMP), to obtain a planar structure surface. In the specification, terms "planar", "flat", or "be of a same height" mean that a height difference between any two points in the plane is within a tolerance of processing. In this way, the shallow trench isolations 6, each of which has a top that is of a same height as that of the nitride layer 5, are formed, as shown in FIG. 5. The shallow trench isolations 6 comprise an insulating material selected from a group consisting of silicon dioxide, silicon oxynitride, and silicon nitride, for example. The shallow trench isolations 6 each have a "T" shape, which comprises a first portion extending downward into the semiconductor substrate and a second portion extending laterally on the buried insulation layer 2. The first portion has a width smaller than that of the second portion. The first portion of the shallow trench isolation 6 isolates the respective backgates in the substrate region of two adjacent MOSFETs that are to be formed. The second portion isolates active layers (i.e., the semiconductor layers 3) of the two adjacent MOSFETs, to define active regions of the MOSFETs. In this way, the backgates as well as the active layers of the two adjacent MOSFETs are prevented from being electrically connected.

Figure 6:
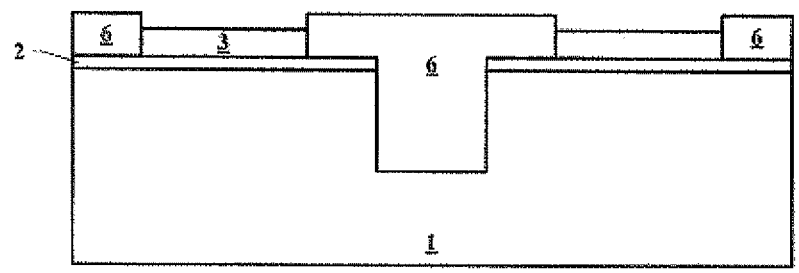

Next, the shallow trench isolations 6 are etched back so that their respective top surfaces are higher than that of the semiconductor layer 3. The nitride layer 5 is removed by wet etching (e.g., by hot phosphoric acid). Then the oxide layer 4 is removed by selective etching process until a top surface of the semiconductor layer 3 is exposed. In this way, a structure as shown in FIG. 6 is formed.

Figure 7:
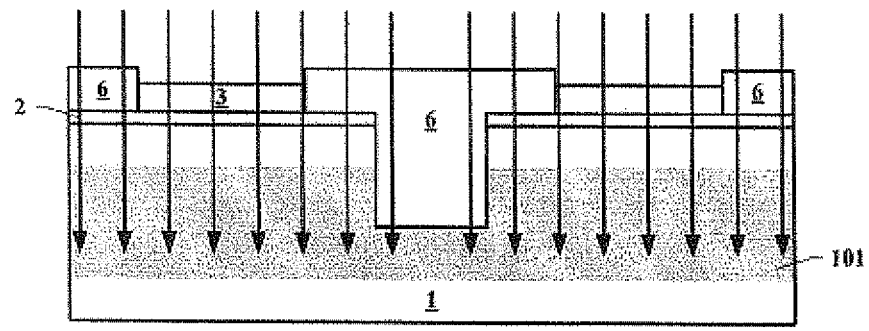
Figure 8:
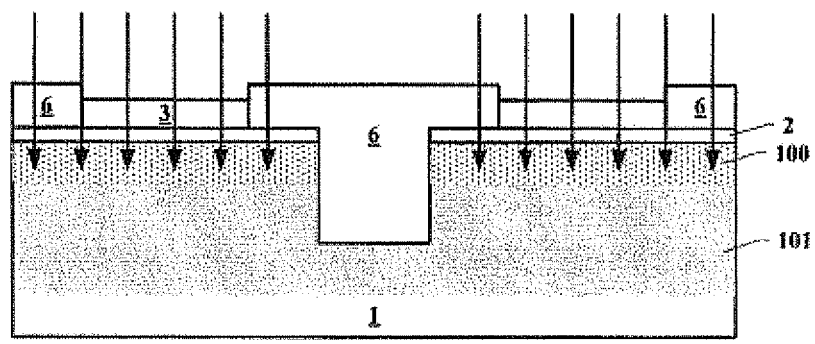
Figure 9:
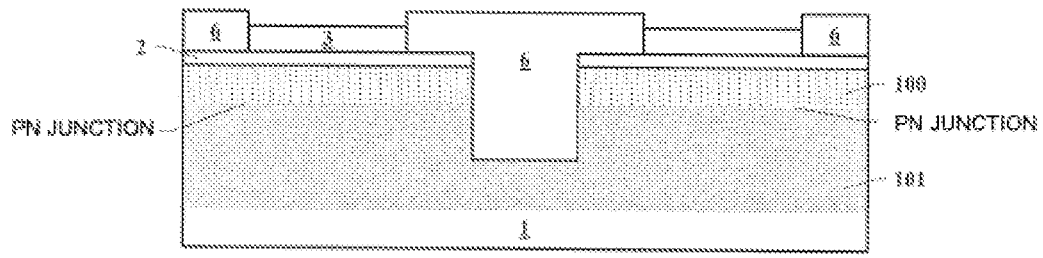
Figure 9:
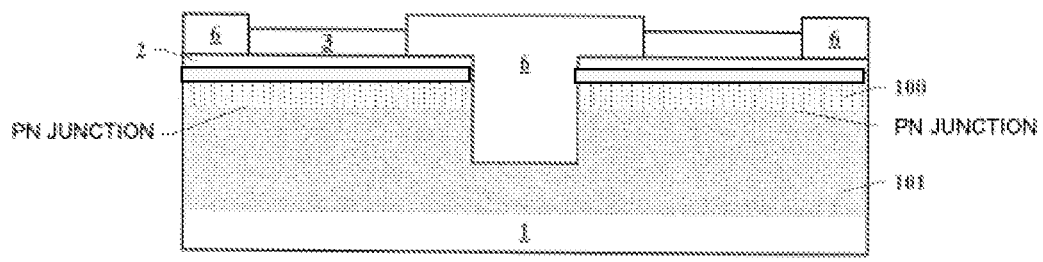

Next, as shown in FIG. 7 and FIG. 8, ion implantations at different depths are conducted in the semiconductor substrate 1, to form the backgates and a common backgate isolation region.

As shown in FIG. 7, firstly, a first deep ion implantation is conducted in the SOI wafer with a first dopant, as indicated by arrows in FIG. 7. In this way, a common backgate isolation region 101 is formed in a deep location of the semiconductor substrate 1.

As shown in FIG. 8, after the completion of the first ion implantation, a second shallow ion implantation is conducted in the SOI wafer with a second dopant, as indicated by arrows in FIG. 8. In this way, backgates 100 are each formed in a shallow location of the semiconductor substrate 1.

The first ion implantation has a deep implantation depth, and the second ion implantation has a shallow implantation depth. Both the first ion implantation and the second ion implantation cover two adjacent regions of the semiconductor substrate 1. Thus two adjacent MOSFETs having a same structure are formed simultaneously. Optionally, the first dopant has a type opposite to that of the second dopant. The backgates 100 and the common back gate isolation region 101 having different conduction types are formed in the semiconductor substrate 1 by means of the two ion implantations that have different types of dopants and different implantation depths. As a result, a PN junction is formed between the two doped regions. Optionally, the backgates 100 have a high ion implantation concentration, and the common backgate isolation region 101 has a low ion implantation concentration. This helps to form a broad (or obscure) border of the PN junction, which can further reduce leakage current.

As shown in FIG. 9(a), two adjacent MOSFETs having a same structure are simultaneously formed by the first and the second ion implantations. The MOSFETs each comprise a respective backgate 100 and a common backgate isolation region 101 under the backgate. The backgate 100 has a doping type opposite to that of the common backgate isolation region 101. Also, the two adjacent MOSFETs are separated by the shallow trench isolation 6.

The shallow trench isolation 6 after being etched back, the semiconductor layer 3, and the insulating buried layer 2 have a total thickness of only about 10 nm-50 nm. As a result, implanted ions can enter the semiconductor substrate 1 through these layers easily. The implantation depth can be controlled by adjusting the ion implantation energy and the dopant dose, so that the implemented dopants are mainly distributed in the semiconductor substrate 1.

The backgates 100 may be disposed in an upper portion of the semiconductor substrate 1 and adjoin the insulating buried layer 2. Alternatively, the backgates 100 may be separated from the insulating buried layer 2 without adjoining it directly, as shown in FIG. 9(b).

The types of the dopants implanted in the ion implantation for forming the backgates 100 may depend on the type of the MOSFETs and a target value of a threshold voltage. If it is desired to decrease the threshold voltage of the device, a P-type dopant may be used for a P-type MOSFET. The P-type dopant may be selected from a group consisting of B, $BF_2$, and In, or a combination thereof. If it desired to increase the threshold voltage of the device, an N-type dopant may be used for a P-type MOSFET. The N-type dopant may be selected from a group consisting of As and P, or a combination thereof. If it desired to increase the threshold voltage of the device, a P-type dopant may be used for an N-type MOSFET. The P-type dopant may be selected from a group consisting of B, $BF_2$, and In, or a combination thereof.

The implantation dose of the dopant may be selected according to process or product requirements. For example, it may be about $1\times10^{13}$ cm$^{-2}$ to $1\times10^{18}$ cm$^{-2}$. In this case, a doping concentration of a portion of the backgate that is not directly under the channel region is about $1\times10^{17}$ cm$^{-3}$ to $1\times10^{20}$ cm$^{-3}$; while a doping concentration of a portion of the backgate that is directly under the channel region is about $1\times10^{15}$ cm$^{-3}$ to $1\times10^{18}$ cm$^{-3}$.

Next, ion implantation annealing (also called "spike annealing") is conducted for a short period, by means of laser, electron beam, or ultra-red irradiation, etc. The ion implantation annealing repairs crystal lattice damages and activates the dopants that have been implanted in the semiconductor substrate 1.

In this way, the backgates 100 and the common backgate isolation region 101 are formed in two adjacent regions in the semiconductor substrate 1, respectively. The two doping regions have dopants of different conduction types, whereby a PN junction is formed at a border of the two doping regions. Furthermore, a shallow trench isolation 6 is formed between the two adjacent regions, so that the backgates of the two adjacent regions can be isolated from each other. Meanwhile, the two adjacent regions have a common backgate isolation region. As a result, a structure of PNP junction or NPN junction is formed by the respective backgates and the common backgate isolation region of the two adjacent regions of the SOI wafer.

Figure 10:
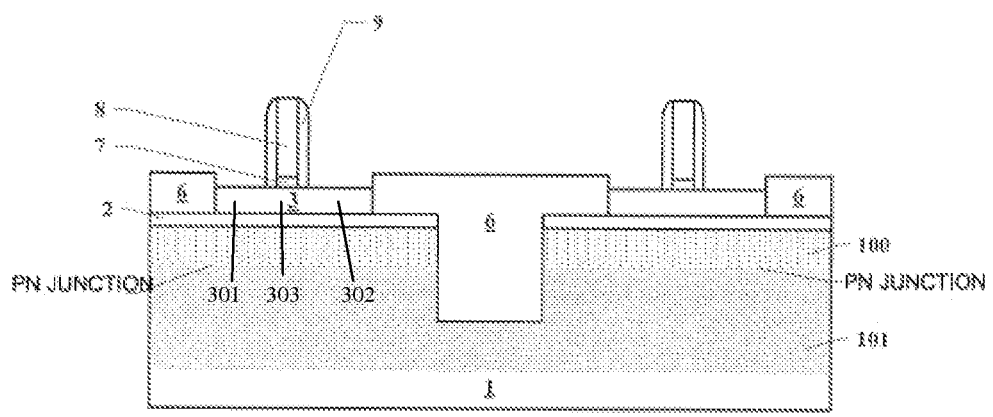

Then, as shown in FIG. 10, other components of the MOSFETs such as gate stacks are formed on active regions of the SOI wafer by means of regular processes.

In particular, each gate stack may comprise a gate dielectric layer 7 and a gate conductive layer 8. The gate dielectric layer 7 may comprise high-K gate dielectric material(s), which may be any one or more of HfO$_2$, HfSiO, HfSiON, HfTaO, HfTiO, HfZrO, Al$_2$O$_3$, La$_2$O$_3$, ZrO$_2$, and LaAlO. For example, the gate dielectric layer 7 may be formed by depositing HfO$_2$ to a thickness of about 2-4 nm. The gate conductive layer 8 is disposed on the gate dielectric layer 7. The gate conductive layer 8 can be used to adjust the threshold voltage of the MOSFET. For a pMOSFET, the gate conductive layer 8 may comprise any one or more of MoNx, TiSiN, TiCN, TaAlC, TiAlN, TaN, PtSix, Ni$_3$Si, Pt, Ru, Ir, Mo, HfRu, and RuOx. For an nMOSFET, the gate conductive layer 8 may comprise any one or more of TaC, TiN, TaTbN, TaErN, TaYbN, TaSiN, HfSiN, MoSiN, RuTax, and NiTax. These materials have different work functions. The material of the gate conductive layer 8 may be selected according to the required threshold voltage of the device. Furthermore, spacers 9 may be formed on both sides of the gate stack.

After the gate stack is formed, source/drain implantation may be conducted outside the gate stack by means of regular CMOS processes. In this way, a source region 301 and a drain region 302 are formed in the semiconductor layer 3 outside the gate stack. Also, a channel region 303 is formed between the source region and the drain region in the semiconductor layer by means of regular CMOS processes.

Figure 11:
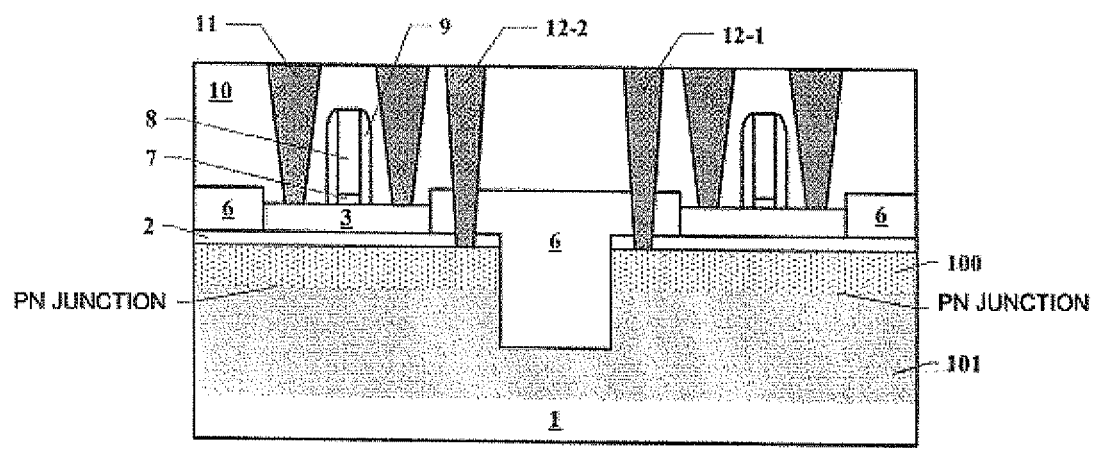

Next, an interlayer dielectric layer 10 is deposited on the SOI wafer. Then conductive vias are formed by means of regular processes. As shown in FIG. 11, source/drain conductive vias are formed to pass through the interlayer dielectric layer 10 and reach the source/drain regions. Backgate conductive vias 12 are formed to pass through the interlayer dielectric layer 10, the second portion of the shallow trench isolation 6 extending laterally, and the insulating buried layer 2, and reach the backgate regions 1.

Then, metal material(s) are filled in the conductive vias 11 and the conductive vias 12, so as to form the source/drain conductive vias 11 electrically connected with the source/drain regions, and back gate conductive vias 12-1 and 12-2 electrically connected with the back gates, as shown in FIG. 11.

As shown in FIG. 11, the present disclosure provides the MOSFETs with a common backgate isolation region. The common backgate isolation region is formed under the backgates of the MOSFETs. The backgates have a different doping type than that of the common backgate isolation region. As a result, respective backgates of two adjacent MOSFETs are isolated from each other by the shallow trench isolation 6. Furthermore, the two adjacent MOSFETs are also isolated from each other by the PNP or NPN junction formed by the respective backgates of the two adjacent MOSFETs and the common backgate isolation. In this way, the respective backgate conductive vias 12-1 and 12-2 of the two adjacent MOSFETs are electrically insulated from each other by the PNP junction or the NPN junction. This device structure has a better insulation effect over the prior art MOSFET and it greatly reduces the possibility of breakthrough.

Moreover, the two adjacent MOSFETs have a common backgate isolation region. Therefore, the structure and manufacturing process of the MOSFETs can be simplified, and the manufacturing time and cost for manufacturing the device can be reduced.

The foregoing description is provided only to illustrate and explain the disclosure, rather than to limit it. Therefore, the present disclosure is not limited to the described embodiments. Any variations or modifications that are obvious to those skilled in the art will fall within the protection scope of the present disclosure.

What is claimed is:

1. A semiconductor device, comprising:
   an SOI wafer comprising a semiconductor substrate, a buried insulation layer, and a semiconductor layer, wherein the buried insulation layer is disposed on the semiconductor substrate, and the semiconductor layer is disposed on the buried insulation layer;
   a plurality of MOSFETs being formed adjacently to each other in the SOI wafer, wherein each of the MOSFETs comprises a respective backgate being formed in the semiconductor substrate; and
   a plurality of first and second shallow trench isolations, each of which being formed between respective adjacent MOSFETs to isolate the respective adjacent MOSFETs,
   wherein:
   the respective adjacent MOSFETs share a common backgate isolation region under and in direct contact with the respective backgate in the semiconductor substrate,
   a PNP junction or an NPN junction is formed by the common backgate isolation region and the respective backgate of the respective adjacent MOSFETs; and
   the first shallow trench isolations are formed on the buried insulation layer; and each of the second shallow trench isolations comprises:
      a first portion extending downward into the semiconductor substrate and being configured to isolate the respective backgate of the respective adjacent MOSFETs from each other; and
      a second portion extending laterally directly on the buried insulation layer and being configured to isolate the semiconductor layer of the respective adjacent MOSFETs from each other so as to define active regions of the respective adjacent MOSFETs, wherein the first portion of the second shallow trench isolation has a width smaller than that of the second portion of the second shallow trench isolation.

2. The semiconductor device according to claim 1, wherein the respective backgate of each of the MOSFETs adjoins the buried insulation layer.

3. The semiconductor device according to claim 1, wherein the respective backgate of each of the MOSFETs is separated from the buried insulation layer.

4. The semiconductor device according to claim 1, wherein the each of the MOSFETs further comprises:
a gate stack being disposed on the semiconductor layer;
a source region and a drain region being formed in the semiconductor layer and being disposed outside the gate stack, respectively; and
a channel region being formed in the semiconductor layer and located between the source region and the drain region.

5. The semiconductor device according to claim 4, wherein the each of the MOSFETs further comprises: source/drain conductive vias configured to be electrically connected with the source region and the drain region, respectively; and a backgate conductive via being electrically connected with the respective backgate.

6. A method for manufacturing a semiconductor device, comprising:
providing an SOI wafer, which comprises a semiconductor substrate, a buried insulation layer, and a semiconductor layer, wherein the buried insulation layer is disposed on the semiconductor substrate, and the semiconductor layer is disposed on the buried insulation layer;
forming a plurality first and second of shallow trench isolations for isolating a plurality of MOSFETs which are to be formed adjacently to each other; and
forming the plurality of the MOSFETs in the SOI wafer, wherein each of the MOSFETs comprises a respective backgate being formed in the semiconductor substrate, wherein:
respective adjacent MOSFETs share a common backgate isolation region under and in direct contact with the respective backgate in the semiconductor substrate,
a PNP junction or an NPN junction is formed by the common backgate isolation region and the respective backgate of the respective adjacent MOSFETs; and
the forming the plurality of the first and second shallow trench isolations comprises:
patterning the SOI wafer to form respective first portions of the second shallow trench isolations, the respective first portions each extending downward into the semiconductor substrate to a depth sufficient for isolating the respective backgate of the each of the MOSFETs from each other; and
further patterning the SOI wafer to form the first shallow trench isolations on the buried insulation and respective second portions of the second shallow trench isolations, the respective second portions each extending laterally directly on the buried insulations layer to isolate the semiconductor layer of the respective adjacent MOSFETs from each other,
wherein the respective first portions of the second shallow trench isolations have a width smaller than that of the respective second portions of the second shallow trench isolations.

7. The method according to claim 6, wherein the forming the plurality of the MOSFETs comprises:
forming the common backgate isolation region in a deep location in the semiconductor substrate by a first deep ion implantation in the semiconductor substrate with a first dopant; and
forming the respective backgate of each of the MOSFETs in a shallow location in the semiconductor substrate by a second shallow ion implantation in the semiconductor substrate with a second dopant,
wherein the second dopant has a type opposite to that of the first dopant.

8. The method according to claim 6, wherein the forming the plurality of the MOSFETs comprises:
forming respective gate stacks of the MOSFETs on the semiconductor layer; and
forming a source region and a drain region outside each of the respective gate stacks in the semiconductor layer.

9. The method according to claim 8, wherein the forming the plurality of the MOSFETs comprises:
forming source/drain conductive vias configured to be electrically connected with the source region and the drain region, respectively; and
forming backgate conductive vias, each of the backgate conductive vias being electrically connected with the respective backgates of each of the MOSFETs.

10. The semiconductor device according to claim 2, wherein the each of the MOSFETs further comprises:
a gate stack being disposed on the semiconductor layer;
a source region and a drain region being formed in the semiconductor layer and being disposed outside the gate stack, respectively; and
a channel region being formed in the semiconductor layer and located between the source region and the drain region.

11. The semiconductor device according to claim 3, wherein the each of the MOSFETs further comprises:
a gate stack being disposed on the semiconductor layer;
a source region and a drain region being formed in the semiconductor layer and being disposed outside the gate stack, respectively; and
a channel region being formed in the semiconductor layer and located between the source region and the drain region.

12. The method according to claim 7, wherein the forming the plurality of the MOSFETs comprises:
forming respective gate stacks of the MOSFETs on the semiconductor layer; and
forming a source region and a drain region outside each of the respective gate stacks in the semiconductor layer.

* * * * *

UNITED STATES PATENT AND TRADEMARK OFFICE
CERTIFICATE OF CORRECTION

| | |
|---|---|
| PATENT NO. | : 9,054,221 B2 |
| APPLICATION NO. | : 13/510807 |
| DATED | : June 9, 2015 |
| INVENTOR(S) | : Huilong Zhu et al. |

It is certified that error appears in the above-identified patent and that said Letters Patent is hereby corrected as shown below:

In the Claims

Col. 8, Clm 1, Line 62
  Delete "directly"

Col. 9, Clm 8, Line 46
  Delete "the" after "forming"

Col. 9, Clm 8, Line 58
  Delete "directly"

Signed and Sealed this
Twelfth Day of April, 2016

Michelle K. Lee
*Director of the United States Patent and Trademark Office*